(12) United States Patent
Kong (10) Patent No.: US 12,302,644 B2
(45) Date of Patent: *May 13, 2025

(54) ELECTROSTATIC DISCHARGE PROTECTION CIRCUIT INCLUDING A FIRST RESISTOR AND A SECOND RESISTOR

(71) Applicant: LX SEMICON CO., LTD., Daejeon (KR)

(72) Inventor: Min Cheol Kong, Daejeon (KR)

(73) Assignee: SILICON WORKS CO., LTD., Daejeon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/220,499

(22) Filed: Jul. 11, 2023

(65) Prior Publication Data

US 2023/0352473 A1    Nov. 2, 2023

Related U.S. Application Data

(63) Continuation of application No. 16/939,248, filed on Jul. 27, 2020, now Pat. No. 11,735,582.

(30) Foreign Application Priority Data

Aug. 16, 2019 (KR) ......................... 10-2019-0100332

(51) Int. Cl.
*H10D 89/60* (2025.01)
*H02H 9/04* (2006.01)

(52) U.S. Cl.
CPC .......... *H10D 89/819* (2025.01); *H02H 9/046* (2013.01)

(58) Field of Classification Search
None
See application file for complete search history.

(56) References Cited

U.S. PATENT DOCUMENTS

| 2002/0033507 A1 | 3/2002 | Maria Verhaege |
| 2005/0018370 A1 | 1/2005 | Arai |

(Continued)

FOREIGN PATENT DOCUMENTS

| CN | 1624920 A | 6/2005 |
| CN | 1855719 A | 11/2006 |

(Continued)

OTHER PUBLICATIONS

Non-Final Office Action dated Dec. 23, 2022, issued by the USPTO for corresponding U.S. Appl. No. 16/939,248; 148 pages.

(Continued)

*Primary Examiner* — Nilufa Rahim
(74) *Attorney, Agent, or Firm* — Greenberg Traurig, LLP; Allen Kim (57) ABSTRACT

An electrostatic discharge (ESD) protection circuit includes a plurality of transistors each including a gate terminal, a drain terminal, and a source terminal, a first connection line connected to the drain terminals of the plurality of transistors, a second connection line connected to the source terminals of the plurality of transistors, a third connection line connected to the gate terminals of the plurality of transistors, an external resistor connected to the third connection line, and a ground terminal connected to the external resistor. The external resistor includes a first resistor and a second resistor connected to each other in parallel.

15 Claims, 5 Drawing Sheets

(56) References Cited

U.S. PATENT DOCUMENTS

| | | |
|---|---|---|
| 2006/0033163 A1 | 2/2006 | Chen |
| 2012/0098046 A1 | 4/2012 | Kim |
| 2014/0210014 A1 | 7/2014 | Ma |
| 2019/0088769 A1* | 3/2019 | Matsushita ......... H01L 27/0664 |
| 2020/0158672 A1 | 5/2020 | Nakane |
| 2020/0212033 A1 | 7/2020 | Chung |

FOREIGN PATENT DOCUMENTS

| | | |
|---|---|---|
| CN | 103151346 A | 6/2013 |
| CN | 103339727 A | 10/2013 |
| KR | 20060128352 A | 12/2006 |
| KR | 10-0699845 B1 | 3/2007 |
| KR | 10-0795328 B1 | 1/2008 |
| KR | 20090026604 A | 3/2009 |

OTHER PUBLICATIONS

Office Action for Korean Patent Application No. 10-2019-0100332, mailed Aug. 26, 2024; 74 pages.
Office Action for Chinese Patent Application No. 202010715708.0, mailed Feb. 28, 2025; 8 pages.

* cited by examiner

ELECTROSTATIC DISCHARGE PROTECTION CIRCUIT INCLUDING A FIRST RESISTOR AND A SECOND RESISTOR

CROSS-REFERENCE TO RELATED APPLICATIONS

This application is a Continuation of U.S. application Ser. No. 16/939,248, filed Jul. 27, 2020, which claims priority of the Korean Patent Applications No. 10-2019-0100332 filed on Aug. 16, 2019, the disclosures of which are incorporated by reference in their entirety.

BACKGROUND

Field of the Invention

The present disclosure relates to an electrostatic discharge (ESD) protection circuit, and particularly, to an ESD protection circuit including a gate-coupled transistor.

Discussion of the Related Art

When a semiconductor circuit contacts an electrified human body or machine, static electricity electrified to the human body or machine may be discharged to the inside of the semiconductor circuit through an input/output (I/O) pad to cause a transient current to flow in a semiconductor internal circuit, and due to this, may damage the semiconductor circuit.

Therefore, in order to prevent the semiconductor internal circuit from being damaged by the static electricity, the semiconductor circuit includes an ESD protection circuit between the I/O pad and the semiconductor internal circuit. When static electricity having an over-voltage flows into the I/O pad, the ESD protection circuit limits, to a certain range, a level of a voltage of a node between the I/O pad and the semiconductor internal circuit, thereby protecting the semiconductor internal circuit.

In the related art, a bipolar junction transistor (BJT) or a diode is mainly used as the ESD protection circuit. However, a gate-grounded NMOS (GGNMOS) transistor is being much used recently. The GGNMOS transistor is a gate-grounded transistor and is an element in which an npn structure of an NMOS transistor operates like a BJT transistor due to breakdown caused by static electricity, and thus, discharges a high amount of current. However, as semiconductor technology advances, a thickness of a gate insulation layer is very thinned, causing an increase in possibility that the gate insulation layer is damaged by an ESD pulse.

Therefore, a gate-coupled NMOS (GCNMOS) transistor, which is designed so that a gate of an NMOS transistor is turned on based on a relatively lower voltage, has been proposed for decreasing the damage of the gate insulation layer.

Particularly, in a case where an ESD protection circuit is configured by connecting a plurality of GCNMOS transistors, the damage of the gate insulation layer may be reduced, and moreover, an ESD effect may be efficiently obtained. In this case, however, a resistance value varies based on a position of the ESD protection circuit, and due to this, the resistance value varies based on a position of gate biasing, causing a reduction in uniformity of a discharged current.

SUMMARY

Accordingly, the present disclosure is directed to providing an ESD protection circuit that substantially obviates one or more problems due to limitations and disadvantages of the related art.

An aspect of the present disclosure is directed to providing an ESD protection circuit which decreases a deviation of a resistance value to enhance the uniformity of a discharged current based on a position.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an electrostatic discharge (ESD) protection circuit including: a plurality of transistors each including a gate terminal, a drain terminal, and a source terminal; a first connection line connected to the drain terminals of the plurality of transistors; a second connection line connected to the source terminals of the plurality of transistors; a third connection line connected to the gate terminals of the plurality of transistors; an external resistor connected to the third connection line; and a ground terminal connected to the external resistor, wherein the external resistor includes a first resistor and a second resistor connected to each other in parallel.

In another aspect of the present disclosure, there is provided an electrostatic discharge (ESD) protection circuit including: a plurality of transistors each including a gate terminal provided on a substrate; an external resistor including a first resistor and a second resistor connected to each other in parallel, on the substrate; a connection line connecting the external resistor to the gate terminal; a ground line connected to the external resistor; a first insulation layer provided in a bottom surface of the gate terminal; a second insulation layer provided in a top surface of the gate terminal; and a third insulation layer provided in a top surface of the ground line, wherein the connection line includes a first connection portion connected to the gate terminal and a second connection portion connecting the first connection portion to the first resistor.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~' and 'next~', one or more other parts may be disposed between the two parts unless 'just' or 'direct' is used.

In describing a time relationship, for example, when the temporal order is described as 'after~', 'subsequent~', 'next~', and 'before~' a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it can be directly on or directly connected to the other element or layer, or intervening elements or layers may be present. Also, it should be understood that when one element is disposed on or under another element, this may denote a case where the elements are disposed to directly contact each other, but may denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

Figure 1:
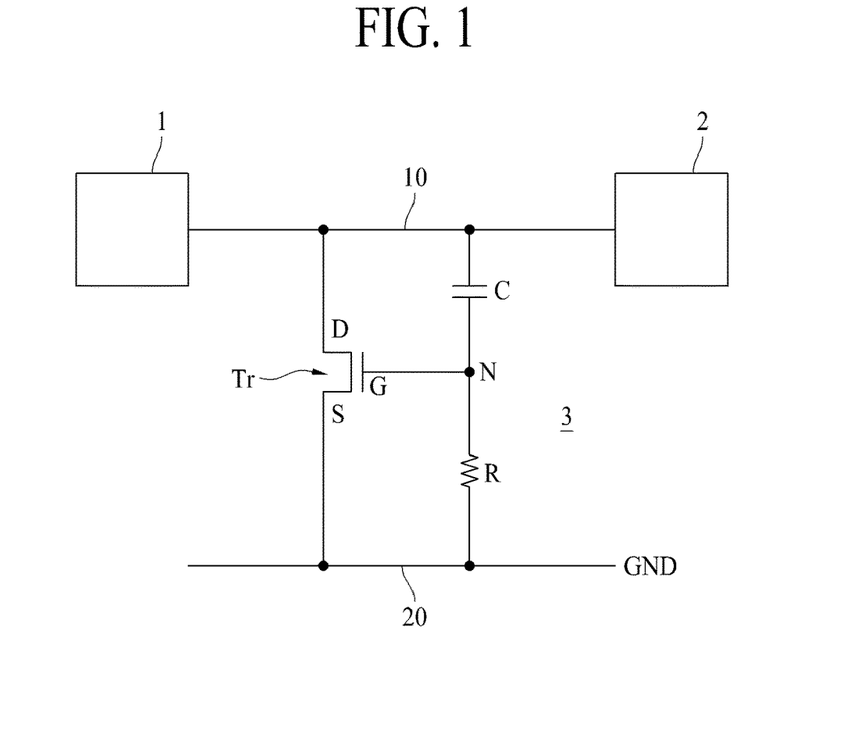
FIG. 1 is a diagram illustrating a unit element configuring an ESD protection circuit according to an embodiment of the present disclosure.

FIG. 1 is a diagram illustrating a unit element configuring an ESD protection circuit 3 according to an embodiment of the present disclosure.

As seen in FIG. 1, the unit element of the ESD protection circuit 3 according to an embodiment of the present disclosure may be provided between an input/output (I/O) pad 1 and a semiconductor internal circuit 2.

The I/O pad 1 and the semiconductor internal circuit 2 may be connected to each other through a first connection line 10, and the unit element of the ESD protection circuit 3 may be connected to the first connection line 10.

The unit element of the ESD protection circuit 3 may include a transistor Tr, a capacitor C, and an external resistor R.

The transistor Tr may include a gate-coupled MOS (GC-MOS) transistor where a gate terminal G thereof is coupled to the I/O pad 1, and particularly, may include a gate-coupled NMOS (GCNMOS) transistor where a gate terminal G thereof is coupled to the I/O pad 1.

A drain terminal D of the transistor Tr may be connected to the I/O pad 1 through the first connection line 10, a source terminal S of the transistor Tr may be connected to a ground terminal GND through a second connection line 20, and a gate terminal G of the transistor Tr may be connected to a node N which is serially connected to the capacitor C and the resistor R.

The capacitor C may be provided between the gate terminal G and the drain terminal D of the transistor Tr. The capacitor C may be implemented as a separate capacitor element, or may be implemented as a parasitic capacitor between the gate terminal G and the drain terminal D. That is, the gate terminal G may overlap the drain terminal D with an insulation layer therebetween, and thus, a parasitic capacitor may be formed therebetween and may be used as the unit element of the ESD protection circuit 3.

The external resistor R may be connected to the capacitor C and the gate terminal G at the node N and may be connected to the ground terminal GND through the second connection line 20. The external resistor R may include a semiconductor material such as polysilicon, but is not limited thereto and may include various materials such as metal.

An operation of the ESD protection circuit 3 will be described below.

When an ESD event occurs from the I/O pad 1, the ESD protection circuit 3 may induce an ESD current to the ground terminal GND to prevent the damage of the semiconductor internal circuit 2. In detail, when an ESD pulse having a high frequency is applied to the I/O pad 1, a current based on the ESD pulse may flow out to the ground terminal GND through the capacitor C and the external resistor R, and at this time, voltage drop may occur due to a current passing through the external resistor R, thereby increasing a gate voltage to turn on the transistor Tr. That is, when the gate voltage at the gate terminal G which is normally grounded increases by the voltage drop, the transistor Tr may be turned on, and thus, a current caused by static electricity may flow to the ground terminal GND through a channel of the transistor Tr, thereby preventing the damage of the semiconductor internal circuit 2.

Figure 2:
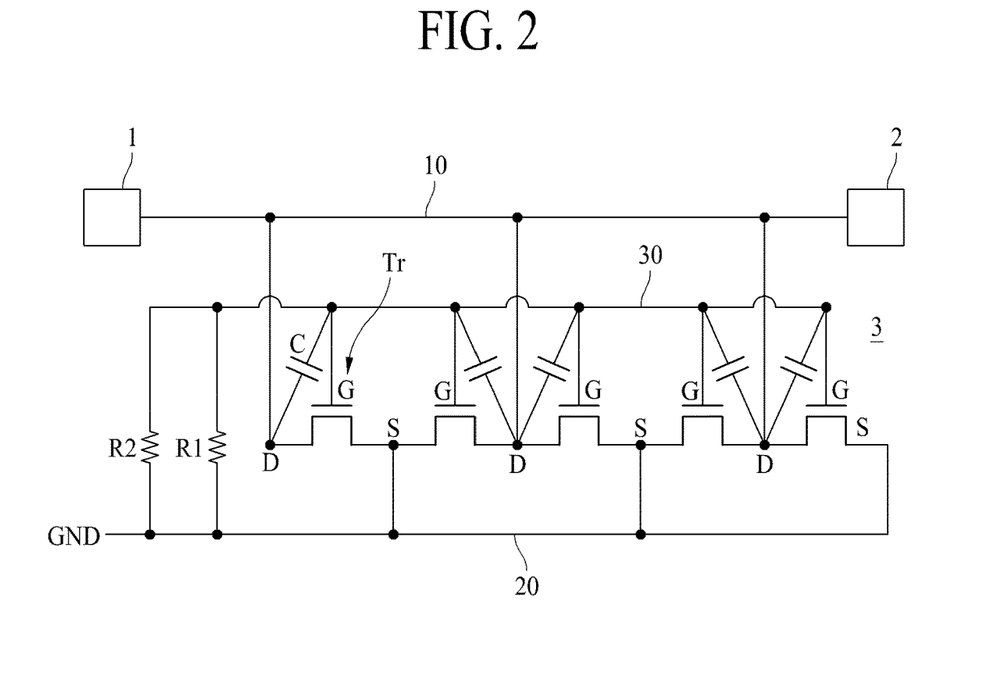
FIG. 2 is a diagram illustrating an ESD protection circuit according to an embodiment of the present disclosure.

FIG. 2 is a diagram illustrating an ESD protection circuit 3 according to an embodiment of the present disclosure.

As seen in FIG. 2, the ESD protection circuit 3 according to an embodiment of the present disclosure may be provided between an I/O pad 1 and a semiconductor internal circuit 2.

The I/O pad 1 and the semiconductor internal circuit 2 may be connected to each other through a first connection line 10, and a drain terminal D of a transistor Tr configuring the ESD protection circuit 3 may be connected to the first connection line 10.

The ESD protection circuit 3 may include a plurality of transistors Tr, a plurality of capacitors C, and a plurality of external resistors R1 and R2.

Each of the plurality of transistors Tr may include a GCMOS transistor where a gate terminal G thereof is coupled to the I/O pad 1, and two adjacent transistors Tr may be arranged to share a source terminal S or a drain terminal D. For example, a source terminal S of a first transistor Tr may function as a source terminal S of a second transistor Tr disposed adjacent thereto at a right side thereof, and a drain terminal D of the second transistor Tr may function as a drain terminal D of a third transistor Tr disposed adjacent thereto at a right side thereof.

Like the above-described embodiment, a drain terminal D of each of the transistors Tr may be connected to the I/O pad 1 through the first connection line 10, and a source terminal S of each of the transistors Tr may be connected to a ground terminal GND through a second connection line 20. Also, a gate terminal G of each of the transistors Tr may be connected to the external resistors R1 and R2 through a third connection line 30.

Each of the plurality of capacitors C may be provided between a gate terminal G and a drain terminal D of a corresponding transistor Tr of the plurality of transistors Tr. Each of the plurality of capacitors C may be implemented as a separate capacitor element, or may be implemented as a parasitic capacitor between the gate terminal G and the drain terminal D.

The external resistors R1 and R2 may include a first resistor R1 and a second resistor R2, and the first resistor R1 and the second resistor R2 may be connected to each other in parallel. One end of each of the first resistor R1 and the second resistor R2 may be connected to the gate terminal G through the third connection line 30, and the other end of each of the first resistor R1 and the second resistor R2 may be connected to the ground terminal GND. Also, the first resistor R1 and the second resistor R2 may be connected to the second connection line 20. The external resistors R1 and R2 may include a semiconductor material such as polysilicon, but are not limited thereto and may include various materials such as metal.

As described above, the ESD protection circuit 3 according to an embodiment of the present disclosure may include the plurality of transistors Tr, the plurality of capacitors C, and the plurality of resistors R1 and R2, thereby more enhancing an ESD prevention effect.

When the ESD protection circuit 3 includes the plurality of transistors Tr, a deviation of a resistance value may occur for each position of the ESD protection circuit 3, and according to an embodiment of the present disclosure, the position-based resistance deviation may be reduced by using configurations of the first resistor R1 and the second resistor R2 disposed in parallel. This will be described below with reference to FIG. 3.

Figure 3:
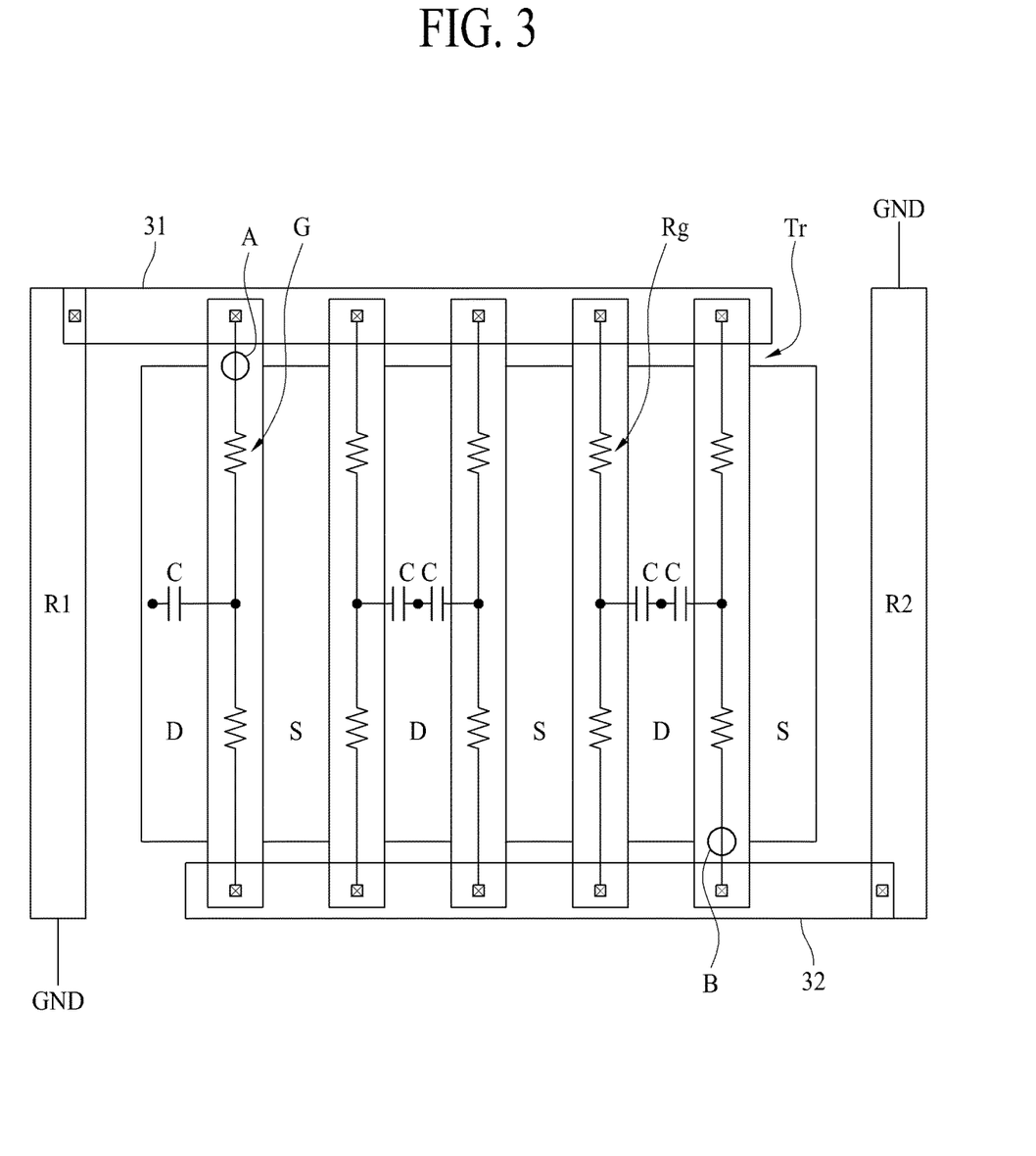
FIG. 3 is a schematic plan view of an ESD protection circuit according to an embodiment of the present disclosure.

FIG. 3 is a schematic plan view of an ESD protection circuit according to an embodiment of the present disclosure.

As seen in FIG. 3, a plurality of transistors Tr each including a gate terminal G, a drain terminal D, and a source terminal S may be arranged in a plurality of rows. In detail, each of the gate terminal G, the drain terminal D, and the source terminal S may be configured in a rectilinear structure extending in one direction (for example, a vertical direction). Particularly, two adjacent transistors Tr may share the drain terminal D or the source terminal S, thereby decreasing an area occupied by the plurality of transistors Tr.

The gate terminal G may have an internal resistor Rg, and the gate terminal G may be formed of a semiconductor material such as polysilicon where the internal resistor Rg has a high resistance value. The capacitor C such as a parasitic capacitor may be provided between the gate terminal G and the drain terminal D.

A plurality of gate terminals G may be connected to a first resistor R1 through a one-side (for example, upper-side) third connection line 31 and may be connected to a second resistor R2 through an other-side (for example, lower-side) third connection line 32. In detail, upper ends of the plurality of gate terminals G may be connected to the one-side third connection line 31 through a contact portion x, the one-side third connection line 31 may be connected to the first resistor R1 through a contact portion x, and the first resistor R1 may be connected to a ground terminal GND. Also, lower ends of the plurality of gate terminals G may be connected to the other-side third connection line 32 through a contact portion x, the other-side third connection line 32 may be connected to the second resistor R2 through a contact portion x, and the second resistor R2 may be connected to the ground terminal GND. In the present specification, the contact portion x may denote a configuration where two layers (for example, a lower layer and an upper layer) disposed apart from each other with an insulation layer therebetween are directly connected to each other through a contact hole passing through the insulation layer or are connected to each other through a via filled into the contact hole.

The one-side third connection line 31 and the other-side third connection line 32 may extend in a direction (for example, a horizontal direction) intersecting with an extension direction of each of the gate terminal G, the drain terminal D, and the source terminal S. Also, the first resistor R1 and the second resistor R2 may extend in the same direction (for example, a vertical direction) as the extension direction of each of the gate terminal G, the drain terminal D, and the source terminal S. The first resistor R1 may be provided at one side (for example, a left outer portion) of each of the plurality of transistors Tr, and the second resistor R2 may be provided at the other side (for example, a right outer portion) of each of the plurality of transistors Tr.

For example, when one of the first resistor R1 and the second resistor R2 is omitted, a large difference between position-based resistance values may occur. For example, a large difference between a resistance value of a region A of a left upper end portion and a resistance value of a region B of a right lower end portion may occur, and particularly, when the number of columns of the plurality of transistors Tr increases or a distance from an upper end of each transistor Tr to a lower end thereof increases, a position-based resistance deviation may more increase. As described above, when a position-based resistance deviation increases, gate biasing may vary for each position, and due to this, the uniformity of a discharged constant current may be reduced.

However, according to an embodiment of the present disclosure, since the first resistor R1 is provided to be electrically connected to one end (for example, an upper end) of each of a plurality of gate terminals G and the second resistor R2 is provided to be electrically connected to the other end of each of the plurality of gate terminals G, a position-based resistance deviation may be reduced, thereby enhancing the uniformity of a discharged current.

Figure 4:
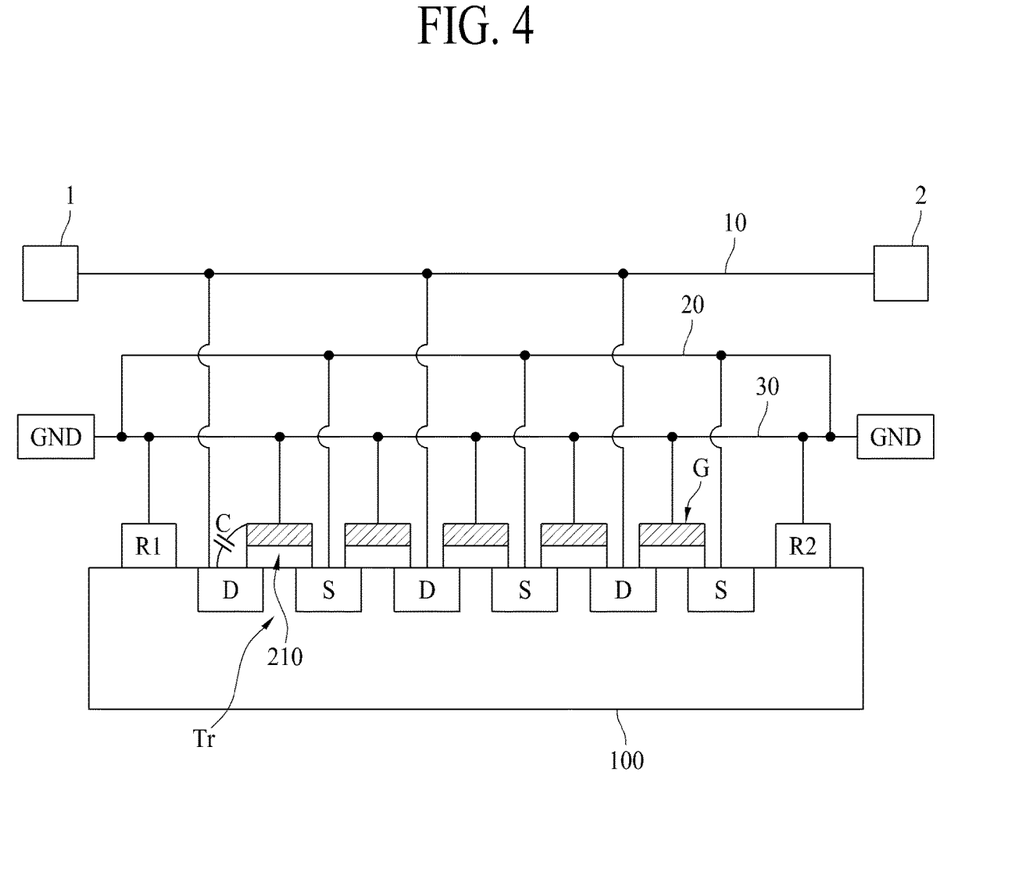
FIG. 4 is a diagram illustrating a schematic cross-sectional shape of an ESD protection circuit according to an embodiment of the present disclosure.

FIG. 4 is a diagram illustrating a schematic cross-sectional shape of an ESD protection circuit according to an embodiment of the present disclosure.

As seen in FIG. 4, a drain terminal D and a source terminal S may be alternately arranged at an upper end of a semiconductor substrate 100, a first insulation layer 210 may be provided on a top surface of the semiconductor substrate 100 and between the drain terminal D and the source terminal S, and a gate terminal G may be provided on the first insulation layer 210. In this case, a certain region of the gate terminal G may overlap a certain region of the drain terminal D, and thus, a parasitic capacitor C may be provided therebetween.

As illustrated, a plurality of transistors Tr may be arranged so that two adjacent transistors Tr share the source terminal S or the drain terminal D.

A first resistor R1 may be provided on the semiconductor substrate 100 at a left outer portion of each of the plurality of transistors Tr, and a second resistor R2 may be provided on the semiconductor substrate 100 at a right outer portion of each of the plurality of transistors Tr.

The drain terminals D of the plurality of transistors Tr may be connected to a first connection line 10 between an I/O pad 1 and a semiconductor internal circuit 2, the source terminals S of the plurality of transistors Tr may be connected to a ground terminal GND through a second connection line 20, and the gate terminals G of the plurality of transistors Tr may be connected to the first resistor R1 and the second resistor R2 through a third connection line 30. For reference, in FIG. 4, the first connection line 10, the second connection line 20, and the third connection line 30 conceptually illustrate an electrical connection between elements.

Figure 5:
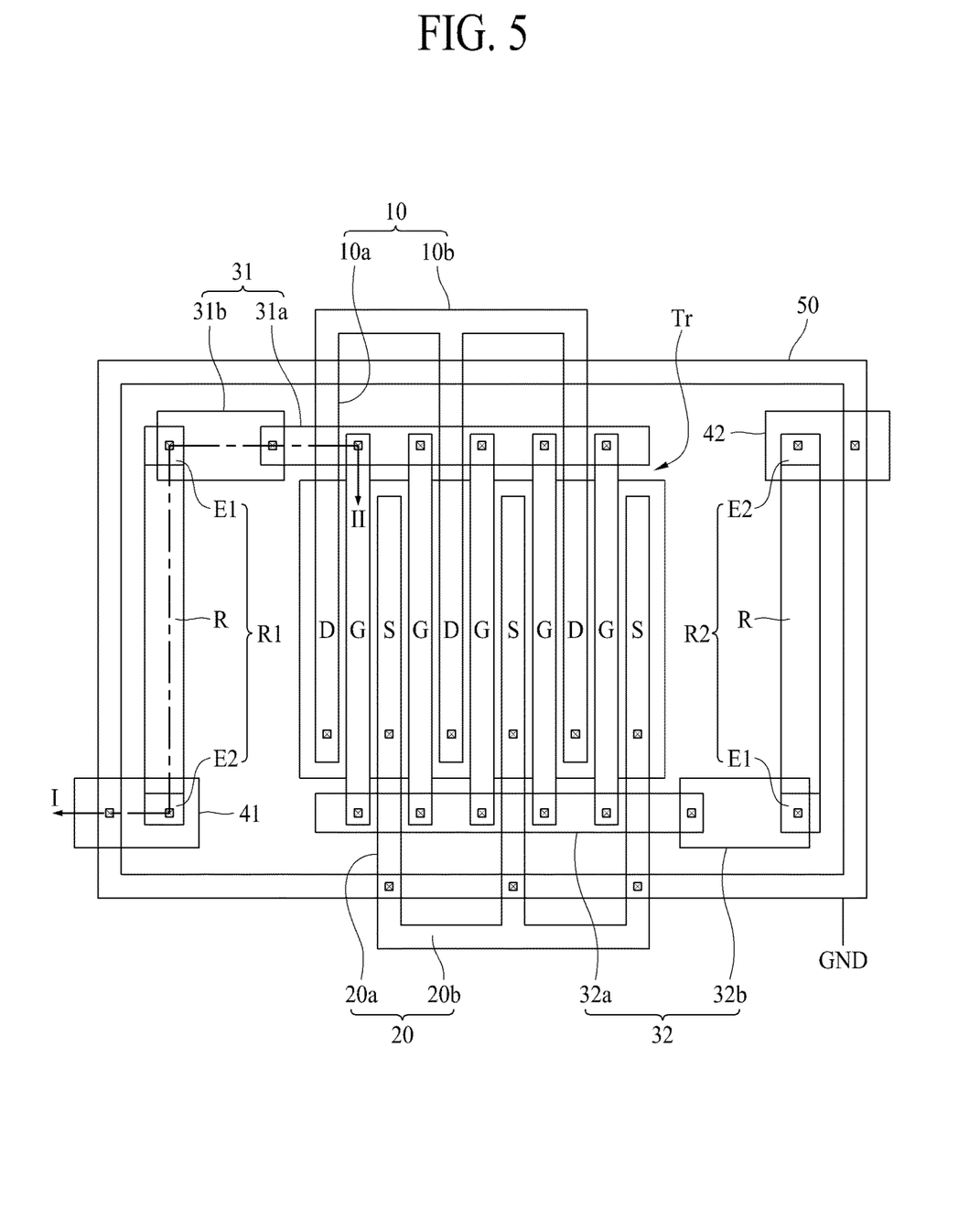
FIG. 5 is a plan view of an ESD protection circuit according to another embodiment of the present disclosure.

FIG. 5 is a plan view of an ESD protection circuit according to another embodiment of the present disclosure.

As seen in FIG. 5, the ESD protection circuit according to another embodiment of the present disclosure may include a plurality of transistors Tr, a plurality of external resistors R1 and R2, a first connection line 10, a second connection line 20, a plurality of third connection lines 31 and 32, a plurality of fourth connection lines 41 and 42, and a ground line 50.

The plurality of transistors Tr may be arranged in a plurality of rows. Each of the plurality of transistors Tr may include a gate terminal G, a drain terminal D, and a source terminal S, which extend in one direction (for example, a vertical direction). Two adjacent transistors Tr may share the drain terminal D or the source terminal S.

One end portion (for example, an upper end portion) of each of a plurality of gate terminals G may be connected to a first resistor R1 through a one-side (for example, upper-side) third connection line 31.

The upper-side third connection line 31 may include a first connection portion 31a and a second connection portion 31b, which extend in a direction (for example, a horizontal direction) which differs from an extension direction of each of the gate terminal G, the drain terminal D, and the source terminal S. The first connection portion 31a may be connected to each of a plurality of gate terminals G through a plurality of contact portions x. The second connection portion 31b may connect the first connection portion 31a to the first resistor R1. Therefore, one end of the second connection portion 31b may be connected to the first connection portion 31a through a contact portion x, and the other end of the second connection portion 31b may be connected to the first resistor R1 through a contact portion x.

The first resistor R1 may include a first electrode E1, a second electrode E2, and a resistance component R. The first electrode E1 and the second electrode E2 may include a metal material, and the resistance component R may include a material, having a high resistance, such as polysilicon.

The first electrode E1 may be connected to one end portion of the resistance component R, and the second electrode E2 may be connected to the other end portion of the resistance component R. The resistance component R may extend in the same vertical direction as an extension direction of each of the gate terminal G, the drain terminal D, and the source terminal S. Therefore, the first electrode E1 may be connected to an upper end of the resistance component R, and the second electrode E2 may be connected to a lower end of the resistance component R. The first resistor R1 may include a plurality of first electrodes E1, a plurality of second electrodes E2, and a plurality of resistance components R, and thus, may be designed to have an appropriate resistance value.

The first electrode E1 of the first resistor R1 may be connected to the second connection portion 31b of the upper-side third connection line 31 through a contact portion x, and the second electrode E2 of the first resistor R1 may be connected to a one-side fourth connection line 41 through a contact portion x.

The one-side fourth connection line 41 may connect the first resistor R1 to the ground line 50. Therefore, one end portion of the one-side fourth connection line 41 may be connected to the second electrode E2 of the first resistor R1 through a contact portion x, and the other end portion of the one-side fourth connection line 41 may be connected to the ground line 50 through a contact portion x.

The other end portion (for example, a lower end portion) of each of the plurality of gate terminals G may be connected to a second resistor R2 through an other-side (for example, lower-side) third connection line 32.

The lower-side third connection line 32 may include a first connection portion 32a and a second connection portion 32b, which extend in a direction (for example, a horizontal direction) which differs from an extension direction of each of the gate terminal G, the drain terminal D, and the source terminal S. The first connection portion 31a may be connected to each of a plurality of gate terminals G through a plurality of contact portions x. The second connection portion 32b may connect the first connection portion 32a to the second resistor R2. Therefore, one end of the second connection portion 32b may be connected to the first connection portion 32a through a contact portion x, and the other end of the second connection portion 32b may be connected to the second resistor R2 through a contact portion x.

Like the first resistor R1 described above, the second resistor R2 may include a first electrode E1, a second electrode E2, and a resistance component R, and the resistance component R may extend in the same vertical direction as an extension direction of each of the gate terminal G, the drain terminal D, and the source terminal S. However, the first electrode E1 of the second resistor R2 may be connected to a lower end of the resistance component R, and the second electrode E2 of the second resistor R2 may be connected to an upper end of the resistance component R. Like the first resistor R1, the second resistor R2 may also include a plurality of first electrodes E1, a plurality of second electrodes E2, and a plurality of resistance components R.

The first electrode E1 of the second resistor R2 may be connected to the second connection portion 32b of the lower-side third connection line 32 through a contact portion x, and the second electrode E2 of the second resistor R2 may be connected to an other-side fourth connection line 42 through a contact portion x.

The other-side fourth connection line 42 may connect the second resistor R2 to the ground line 50. Therefore, one end portion of the other-side fourth connection line 42 may be connected to the second electrode E2 of the second resistor R2 through a contact portion x, and the other end portion of the other-side fourth connection line 42 may be connected to the ground line 50 through a contact portion x.

The first connection line 10 may include a plurality of first connection portions 10a and a second connection portion 10b connecting the plurality of first connection portions 10a. The plurality of first connection portions 10a may be provided to extend in the same direction as the plurality of drain terminals D and to overlap the plurality of drain terminals D. Also, the plurality of first connection portions 10a may be respectively connected to the plurality of drain terminals D through a contact portion x. The second connection portion 10b may connect upper end portions of the plurality of first connection portions 10a. Although not shown, the second connection portion 10b of the first connection line 10 may be connected to an I/O pad.

The first connection line 10 may intersect with the first connection portion 31a of the one-side third connection line 31 and the ground line 50, and thus, in order to prevent short circuit, the first connection line 10 is provided on a layer different from the first connection portion 31a of the one-side third connection line 31 and the ground line 50. In detail, the first connection line 10 may be provided on a layer which is higher than the first connection portion 31a of the one-side third connection line 31 and the ground line 50. The first connection line 10 may be provided on the same layer as the second connection portion 31b of the one-side third connection line 31. A plurality of first connection portions 10a and second connection portions 10b configuring the first connection line 10 may be formed of the same conductive material and may be provided as one body.

The second connection line 20 may include a plurality of first connection portions 20a and a second connection portion 20b connecting the plurality of first connection portions 20a. The plurality of first connection portions 20a may be provided to extend in the same direction as the plurality of source terminals S and to overlap the plurality of source terminals S. Also, the plurality of first connection portions 20a may be respectively connected to the plurality of source terminals S through a contact portion x. The second connection portion 20b may connect lower end portions of the plurality of first connection portions 20a.

The second connection line 20 may intersect with a first connection portion 32a of an other-side third connection line 32, and thus, in order to prevent short circuit, the second connection line 20 and the first connection portion 32a of the other-side third connection line 32 may be provided on different layers. In detail, the second connection line 20 may be provided on a layer which is higher than the first connection portion 32a of the other-side third connection line 32. The second connection line 20 may be provided on the same layer as the second connection portion 32b of the other-side third connection line 32. A plurality of first connection portions 20a and second connection portions 20b configuring the second connection line 20 may be formed of the same conductive material and may be provided as one body. The second connection line 20 and the first connection line 10 may be formed of the same material at the same layer.

Moreover, the second connection line 20 may be connected to the ground line 50 through a contact portion x. Although an example where the plurality of first connection portions 20a of the second connection line 20 are connected to the ground line 50 through a plurality of contact portions x is illustrated, the second connection portion 20b of the second connection line 20 may be connected to the ground line 50 through a plurality of contact portions x.

The third connection lines 31 and 32, as described above, may include a one-side third connection line 31 and an other-side third connection line 32. A first connection portion 31a of the one-side third connection line 31 and a first connection portion 32a of the other-side third connection line 32 may be formed of the same material on the same layer. Also, a second connection portion 31b of the one-side third connection line 31 and a second connection portion 32b of the other-side third connection line 32 may be formed of the same material on the same layer. The second connection portion 31b of the one-side third connection line 31 may diagonally face the second connection portion 32b of the other-side third connection line 32.

The fourth connection lines 41 and 42, as described above, may include a one-side fourth connection line 41 and an other-side fourth connection line 42. The one-side fourth connection line 41 and the other-side fourth connection line 42 may be formed of the same material on the same layer. The one-side fourth connection line 41 may diagonally face the other-side fourth connection line 42.

The fourth connection lines 41 and 42, the first connection line 10, the second connection line 20, and the second connection portions 31b and 32b of the third connection lines 31 and 32 may be formed of the same material on the same layer.

The ground line 50 may be provided at an outer portion of each of the plurality of transistors Tr, and particularly, may be provided to surround the plurality of transistors Tr. For example, the ground line 50 may be formed in a tetragonal frame structure. Also, the ground line 50 may be provided at an outer portion of each of the first resistor R1, the second resistor R2, and the third connection lines 31 and 32.

The ground line 50 and the first connection portions 31a and 32a of the third connection lines 31 and 32 may be formed of the same material on the same layer.

Figure 6:
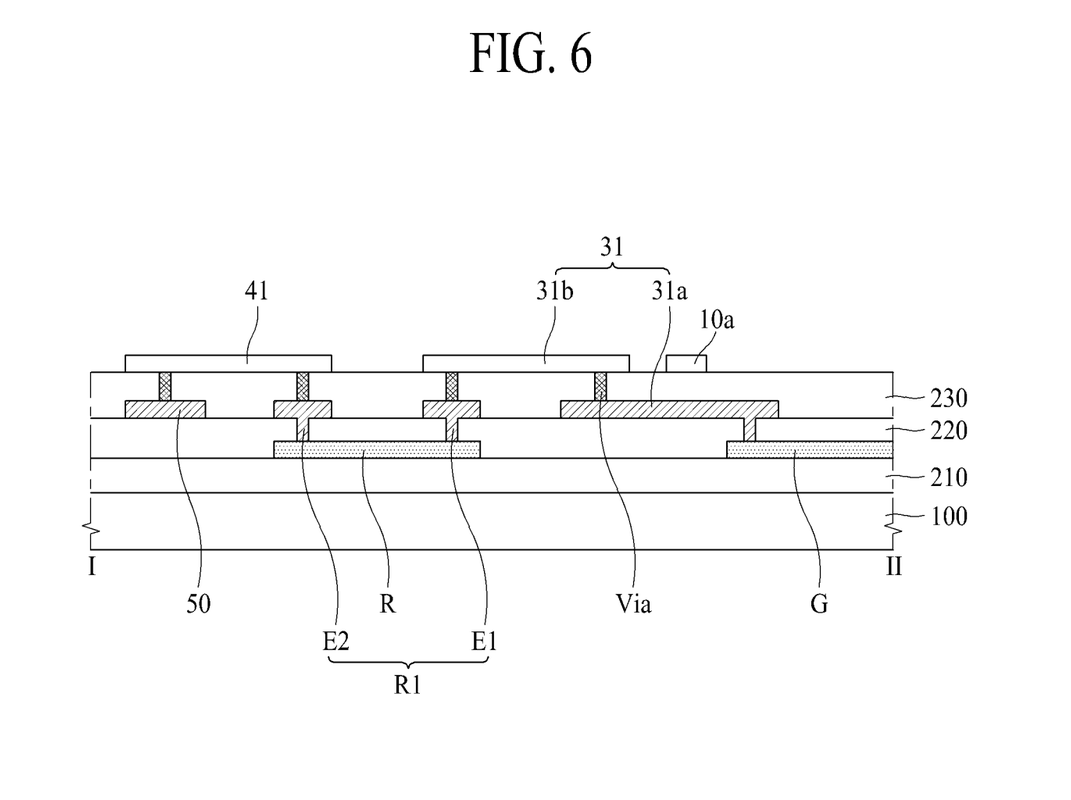
FIG. 6 is a cross-sectional view of an ESD protection circuit according to another embodiment of the present disclosure and is a cross-sectional view taken along line I-II of FIG. 5.

FIG. 6 is a cross-sectional view of an ESD protection circuit according to another embodiment of the present disclosure and is a cross-sectional view taken along line I-II of FIG. 5.

As seen in FIG. 6, a first insulation layer 210 may be formed on a substrate 100, and a resistance component R of a first resistor R1 and a gate terminal G of a transistor may be formed apart from each other on the first insulation layer 210. The resistance component R and the gate terminal G may be formed of the same material on the same layer, and for example, may include a semiconductor material such as polysilicon.

A second insulation layer 220 may be formed on the resistance component R and the gate terminal G, and a ground line 50, a first electrode E1 and a second electrode E2 of a first resistor R1, and a first connection portion 31a of a one-side third connection line 31 may be formed apart from one another on the second insulation layer 220.

The ground line 50, the first electrode E1 and the second electrode E2 of the first resistor R1, and the first connection portion 31a of the one-side third connection line 31 may be formed of the same conductive material on the same layer.

The first electrode E1 and the second electrode E2 of the first resistor R1 may be respectively connected to one end and the other end of the resistance component R through a contact hole provided in the second insulation layer 220, but are not limited thereto and may be connected thereto through a via filled into the contact hole. The first connection portion 31a of the one-side third connection line 31 may be connected to one end of the gate terminal G through a contact hole provided in the second insulation layer 220, but is not limited thereto and may be connected thereto through a via filled into the contact hole.

A third insulation layer 230 may be formed on the ground line 50, the first electrode E1 and the second electrode E2 of the first resistor R1, and the first connection portion 31a of the one-side third connection line 31, and a one-side fourth connection line 41, a second connection portion 31b of the one-side third connection line 31, and a first connection portion 10a of a first connection line 10 may be formed apart from one another on the third insulation layer 230.

The one-side fourth connection line 41, the second connection portion 31b of the one-side third connection line 31, and the first connection portion 10a of the first connection line may be formed of the same conductive material on the same layer.

One end of the one-side fourth connection line 41 may be connected to the ground line 50 through a via provided in the third insulation layer 230, and the other end of the one-side fourth connection line 41 may be connected to the second electrode E2 of the first resistor R1 through a via provided in the third insulation layer 230. Alternatively, the one-side fourth connection line 41 may be directly connected to the ground line 50 and the second electrode E2 of the first resistor R1 through a contact hole provided in the third insulation layer 230.

One end of the second connection portion 31b of the one-side third connection line 31 may be connected to the first electrode E1 of the first resistor R1 through a via provided in the third insulation layer 230, and the other end of the second connection portion 31b of the one-side third connection line 31 may be connected to the first connection portion 31a of the one-side third connection line 31 through a via provided in the third insulation layer 230. Alternatively, the second connection portion 31b of the one-side third connection line 31 may be directly connected to the first electrode E1 of the first resistor R1 and the first connection portion 31a of the one-side third connection line 31 through a contact hole provided in the third insulation layer 230.

Hereinabove, FIG. 6 illustrates a cross-sectional surface of a line crossing the ground line 50, the one-side fourth connection line 41, the first resistor R1, the one-side third connection line 31, the first connection line 10, and the gate terminal G each illustrated in FIG. 5, and moreover, a cross-sectional surface of a line crossing the ground line 50, the other-side fourth connection line 42, the second resistor R2, the other-side third connection line 32, the second connection line 20, and the gate terminal G each illustrated in FIG. 5 may have the same structure as FIG. 6.

According to an embodiment of the present disclosure, since a first resistor is provided to be electrically connected to one end of each of gate terminals of a plurality of transistors and a second resistor is provided to be electrically connected to the other end of each of the gate terminals of the plurality of transistors, a position-based resistance deviation may be reduced, thereby enhancing the uniformity of a discharged current.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An electrostatic discharge (ESD) protection circuit comprising:
   a plurality of transistors each including a gate terminal, a drain terminal, and a source terminal;
   a first connection line connecting the drain terminal of each of the plurality of transistors;
   a second connection line connecting the source terminal of each of the plurality of transistors;
   a third connection line connecting the gate terminal of each of the plurality of transistors;
   a first resistor connecting the third connection line and ground;
   a fourth connection line connecting the gate terminal of each of the plurality of transistors; and
   a second resister connecting the fourth connection line and the ground,
   wherein the gate terminal of each of the plurality of transistors is connected to the third connection line and the fourth connection line.

2. The ESD protection circuit of claim 1, wherein the first resistor is provided one side of the plurality of transistors, the second resistor is provided the other side of the plurality of transistors, and the first resistor, the second resistor and the gate terminal of each of the plurality of transistors extend in the same direction.

3. The ESD protection circuit of claim 2, wherein the first resistor and the second resistor are provided outside of the plurality of transistors, and the first resistor, the second resistor, and the gate terminal of each of the plurality of transistors are arrayed in parallel.

4. The ESD protection circuit of claim 1, wherein each of the plurality of transistors are connected to each other in parallel.

5. The ESD protection circuit of claim 1, wherein the third connection line comprises a first connection portion connecting each of the gate terminals and a second connection portion connecting the first connection portion to the first resistor, and the fourth connection line comprises a first connection portion connecting each of the gate terminals and a second connection portion connecting the first connection portion of the fourth connection line to the second resistor.

6. The ESD protection circuit of claim 5, wherein the first connection portion of the third connection line intersects with the first connection line, and the first connection portion of the fourth connection line intersects with the second connection line.

7. The ESD protection circuit of claim 5, wherein the second connection portion of the third connection line, the second connection portion of the fourth connection line, the first connection line, and the second connection line are provided on the same layer and comprise the same conductive material.

8. The ESD protection circuit of claim 1, further comprising:

a ground line for the ground provided outside the plurality of transistors;

a fifth connection line connecting the ground line to the first resistor; and a sixth connection line connecting the ground line to the second resistor.

9. The ESD protection circuit of claim 8, wherein the fifth connection line, the sixth connection line, the first connection line, and the second connection line are provided on the same layer and comprise the same conductive material.

10. The ESD protection circuit of claim 1, wherein each of the first resistor and the second resistor comprises a resistance component, a first electrode connected to one end of the resistance component, and a second electrode connected to the other end of the resistance component, and wherein the resistance component is provided on the same layer as the gate terminal and comprises the same material as a material of the gate terminal.

11. The ESD protection circuit of claim 1, wherein the first connection line comprises a plurality of first connection portions, connected to the drain terminal to extend in the same direction as an extension direction of the drain terminal, and a second connection portion connecting the plurality of first connection portions.

12. The ESD protection circuit of claim 1, wherein the plurality of transistors comprises two adjacent transistors sharing the source terminal or the drain terminal.

13. The ESD protection circuit of claim 1, wherein each of the plurality of transistors comprises an adjacent transistor.

14. The ESD protection circuit of claim 13, wherein each of the plurality of transistors and the adjacent transistor share the source terminal.

15. The ESD protection circuit of claim 13, wherein each of the plurality of transistors and the adjacent transistor share the drain terminal.

* * * * *